United States Patent
Zhang et al.

(10) Patent No.: US 10,088,516 B2
(45) Date of Patent: Oct. 2, 2018

(54) SYSTEMS AND METHODS FOR DETECTING TURN-TO-TURN FAULTS IN WINDINGS

(71) Applicant: General Electric Company, Schenectady, NY (US)

(72) Inventors: Zhiying Zhang, Markham (CA); Sarasij Das, Bangalore (IN); Tarlochan Sidhu, Ajax (CA); Mohammad Reza Dadash Zadeh, Irvine, CA (US)

(73) Assignee: General Electric Company, Schenectady, NY (US)

( * ) Notice: Subject to any disclaimer, the term of this patent is extended or adjusted under 35 U.S.C. 154(b) by 372 days.

(21) Appl. No.: 15/040,536

(22) Filed: Feb. 10, 2016

(65) Prior Publication Data
US 2017/0227594 A1    Aug. 10, 2017

(51) Int. Cl.
| | |
|---|---|
| *H02H 7/04* | (2006.01) |
| *G01R 31/06* | (2006.01) |
| *G01R 31/08* | (2006.01) |
| *H02H 7/045* | (2006.01) |

(52) U.S. Cl.
CPC ........... *G01R 31/06* (2013.01); *G01R 31/085* (2013.01); *H02H 7/045* (2013.01)

(58) Field of Classification Search
USPC ............................................. 324/547; 361/36
See application file for complete search history.

(56) References Cited

U.S. PATENT DOCUMENTS

| | | | | |
|---|---|---|---|---|
| 3,863,109 A | * | 1/1975 | Emanuel ............... | H01F 27/402 324/547 |
| 4,377,833 A | | 3/1983 | Udren | |

(Continued)

FOREIGN PATENT DOCUMENTS

| | | |
|---|---|---|
| WO | 97/37236 A1 | 10/1997 |
| WO | 101025434 A | 8/2007 |

(Continued)

OTHER PUBLICATIONS

International Search Report and Written Opinion issued in connection with corresponding PCT Application No. PCT/US17/17282 dated Apr. 28, 2017.

(Continued)

*Primary Examiner* — Ronald W Leja
(74) *Attorney, Agent, or Firm* — Eversheds-Sutherland (US) LLP

(57) ABSTRACT

Embodiments of the disclosure relate to detecting turn-to-turn faults in one or more windings of various objects. In one implementation, a fault detector uses a differential protection algorithm to detect a turn-to-turn fault in a winding of a three-phase shunt reactor. Various voltage and current measurements carried out upon the three-phase shunt reactor are used to calculate a difference value between a voltage-based parameter and a current-based parameter. The voltage-based parameter is indicative of a normalized negative voltage imbalance and the current-based parameter is indicative of a normalized negative current imbalance. A turn-to-turn winding fault is declared when the difference value is not equal to zero.

20 Claims, 10 Drawing Sheets

(56) References Cited

U.S. PATENT DOCUMENTS

| | | | | |
|---|---|---|---|---|
| 4,851,766 A * | 7/1989 | Shiobara | ............ | G01R 31/343 |
| | | | | 318/490 |
| 5,514,978 A * | 5/1996 | Koegl | ................ | G01R 31/346 |
| | | | | 318/690 |
| 6,043,664 A * | 3/2000 | Kliman | ............... | G01R 31/343 |
| | | | | 324/545 |
| 7,812,615 B2 | 10/2010 | Gajic et al. | | |
| 7,903,381 B2 | 3/2011 | Fischer et al. | | |
| 9,726,706 B1 | 8/2017 | Zhang et al. | | |
| 2009/0231769 A1* | 9/2009 | Fischer | ................. | H02H 3/286 |
| | | | | 361/87 |
| 2013/0054204 A1 | 2/2013 | Zhang et al. | | |
| 2017/0227591 A1* | 8/2017 | Zhang | ................. | G01R 31/025 |
| 2017/0227594 A1* | 8/2017 | Zhang | ................... | G01R 31/06 |

FOREIGN PATENT DOCUMENTS

| | | |
|---|---|---|
| WO | 101651328 B | 10/2011 |
| WO | 2013/004285 A1 | 1/2013 |
| WO | 2015/070407 A1 | 5/2015 |

OTHER PUBLICATIONS

Faridul Katha Basha, et al. "Practical EHV Reactor Protection." Protective Relay Engineers, 66th Annual Conference for IEEE, 2013, pp. 1-12, no month.

Bogdan Kasztenny, et al. "Negative-Sequence Differential Protection—Principles, Sensitivity, and Security." Protective Relay Engineers, 68th Annual Conference for IEEE, 2015, pp. 1-15, no month.

* cited by examiner (A)

735
using each of the first phase current measurement, the second phase current measurement, the third phase current measurement, the first phase voltage measurement, the second phase voltage measurement, and the third phase voltage measurement detect the turn-to-turn fault in at least one of the first winding, the second winding, or the third winding of the three-phase shunt reactor by calculating a difference value between a voltage-based parameter and a current-based parameter, wherein the voltage-based parameter is indicative of a normalized negative voltage imbalance and the current-based parameter is indicative of a normalized negative current imbalance

740
declare the turn-to-turn fault in at least one of the first winding, the second winding, or the third winding of the three-phase shunt reactor when the difference value is not equal to zero

FIG. 7B

SYSTEMS AND METHODS FOR DETECTING TURN-TO-TURN FAULTS IN WINDINGS

FIELD OF THE DISCLOSURE

This disclosure relates to winding fault detectors, and more particularly, to turn-to-turn winding fault detector systems and methods.

BACKGROUND OF THE DISCLOSURE

Winding coils are incorporated into a wide variety of products, for example, into inductors and transformers. More particularly, in electrical power transmission systems, various components, for example, a power transformer or a shunt reactor, can include one or more winding coils. Various types of faults can occur in these windings when in use. Some of these faults, for example, a short circuit between the output terminals of a power transformer are more readily detectable than other faults such as, an internal short circuit between a few turns of a primary winding or a secondary winding of the power transformer. The internal short circuit between the few turns may not necessarily result in a significant change in the amount of current being delivered by the power transformer to a power transmission line that is coupled to the power transformer. However, if timely remedial action is not taken, such a fault can eventually develop into a major fault that can severely impact power transmission through the power transmission line.

Conventional fault detection devices which are typically configured to detect significant current changes in various types of windings may be unable to effectively detect small turn-to-turn faults in such windings. More particularly, conventional fault detection devices may lack adequate sensitivity to detect changes in low amplitude differential currents that are indicative of turn-to-turn faults. Consequently, some solutions have been proposed that are directed at detecting turn-to-turn faults using other techniques. For example, one conventional solution generally pertains to fault detection in a power transformer or power line by using various phase current measurements to identify a source of negative sequence differential current, wherein such a source is indicative of a fault. Another conventional example generally pertains to a negative sequence differential element that is used to detect a fault in an electrical power system by computing a differential between negative sequence values derived from a first phase-current measurement and a second phase-current measurement.

Conventional solutions using negative sequence differential currents for fault detection can be impacted by various system imbalance conditions that can impact the sensitivity and the reliability of the detection process. Further, even when a fault is detected, the precise location of the fault in terms of a particular phase in a multi-phase system may not be identifiable.

BRIEF DESCRIPTION OF THE DISCLOSURE

Embodiments of the disclosure are directed generally to systems and methods for detecting turn-to-turn faults in winding.

According to one exemplary embodiment of the disclosure, a three-phase power line system can include a first power line conductor, a second power line conductor, a third power line conductor, a three-phase shunt reactor, a first electrical current monitoring element, a second electrical current monitoring element, a third electrical current monitoring element, a first voltage monitoring element, a second voltage monitoring element, a third voltage monitoring element, and a fault detector. The first power line conductor transfers power in a first phase, the second power line conductor transfers power in a second phase, and the third power line conductor transfers power in a third phase. The three-phase shunt reactor is coupled to the three-phase power line system. The first electrical current monitoring element is configured to provide a first current measurement based on monitoring a first phase current flowing through a first winding of the three-phase shunt reactor. The second electrical current monitoring element is configured to provide a second current measurement based on monitoring a second phase current flowing through a second winding of the three-phase shunt reactor. The third electrical current monitoring element is configured to provide a third current measurement based on monitoring a third phase current flowing through a third winding of the three-phase shunt reactor. The first voltage monitoring element is configured to provide a first voltage measurement based on monitoring a first phase voltage present on the first power line conductor. The second voltage monitoring element is configured to provide a second voltage measurement based on monitoring a second phase voltage present on the second power line conductor. The third voltage monitoring element is configured to provide a third voltage measurement based on monitoring a third phase voltage present on the third power line conductor. The fault detector is configured to receive and to use each of the first phase current measurement, the second phase current measurement, the third phase current measurement, the first phase voltage measurement, the second phase voltage measurement, and the third phase voltage measurement to detect a turn-to-turn fault in at least one of the first winding, the second winding, or the third winding of the three-phase shunt reactor by executing a procedure. The procedure includes calculating a difference value between a voltage-based parameter and a current-based parameter, wherein the voltage-based parameter is indicative of a normalized negative voltage imbalance and the current-based parameter is indicative of a normalized negative current imbalance, and further includes declaring an occurrence of the turn-to-turn fault in at least one of the first winding, the second winding, or the third winding of the three-phase shunt reactor when the difference value is not equal to zero.

According to another exemplary embodiment of the disclosure, a turn-to-turn fault detector can include a first input interface, a second input interface, a third input interface, a fourth input interface, a fifth input interface, a sixth input interface, and at least one processor. The first input interface is configured to receive a first phase current measurement that is based on monitoring a first phase current flowing through a first winding of a three-phase shunt reactor, wherein the first winding is coupled to a first power line conductor of a three-phase power line system. The second input interface configured to receive a second phase current measurement that is based on monitoring a second phase current flowing through a second winding of the three-phase shunt reactor, wherein the second winding is coupled to a second power line conductor of the three-phase power line system. The third input interface configured to receive a third phase current measurement that is based on monitoring a third phase current flowing through a third winding of the three-phase shunt reactor, wherein the third winding is coupled to a third power line conductor of the three-phase power line system. The fourth input interface configured to receive a first phase voltage measurement that is based on monitoring a first phase voltage present on the first power line conductor of the three-phase power line system. The fifth input interface configured to receive a second phase voltage measurement that is based on monitoring a second phase voltage present on the second power line conductor of the three-phase power line system. The sixth input interface configured to receive a third phase voltage measurement that is based on monitoring a third phase voltage present on the third power line conductor of the three-phase power line system. The processor is configured to use each of the first phase current measurement, the second phase current measurement, the third phase current measurement, the first phase voltage measurement, the second phase voltage measurement, and the third phase voltage measurement to detect a turn-to-turn fault in at least one of the first winding, the second winding, or the third winding of the three-phase shunt reactor by executing a procedure that includes calculating a difference value between a voltage-based parameter and a current-based parameter, wherein the voltage-based parameter is indicative of a normalized negative voltage imbalance and the current-based parameter is indicative of a normalized negative current imbalance, and further includes declaring a turn-to-turn fault in at least one of the first winding, the second winding, or the third winding of the three-phase shunt reactor when the difference value is not equal to zero.

According to yet another exemplary embodiment of the disclosure, a method for detecting a turn-to-turn fault in a three-phase shunt reactor coupled to a three-phase power line system can include operations such as receiving a first phase current measurement that is based on monitoring a first phase current flowing through a first winding of the three-phase shunt reactor; receiving a second phase current that is based on monitoring a second phase current flowing through a second winding of the three-phase shunt reactor; receiving a third phase current measurement that is based on monitoring a third phase current flowing through a third winding of the three-phase shunt reactor; receiving a first phase voltage measurement that is based on monitoring a first phase voltage present on a first power line conductor of the three-phase power line system; receiving a second phase voltage measurement that is based on monitoring a second phase voltage present on a second power line conductor of the three-phase power line system; receiving a third phase voltage measurement that is based on monitoring a third phase voltage present on a third power line conductor of the three-phase power line system; and using each of the first phase current measurement, the second phase current measurement, the third phase current measurement, the first phase voltage measurement, the second phase voltage measurement, and the third phase voltage measurement to detect the turn-to-turn fault in at least one of the first winding, the second winding, or the third winding of the three-phase shunt reactor by calculating a difference value between a voltage-based parameter and a current-based parameter, wherein the voltage-based parameter is indicative of a normalized negative voltage imbalance and the current-based parameter is indicative of a normalized negative current imbalance. A turn-to-turn fault in at least one of the first winding, the second winding, or the third winding of the three-phase shunt reactor is declared when the difference value is not equal to zero.

Other embodiments and aspects of the disclosure will become apparent from the following description taken in conjunction with the following drawings.

BRIEF DESCRIPTION OF THE DRAWINGS

Figure 1:
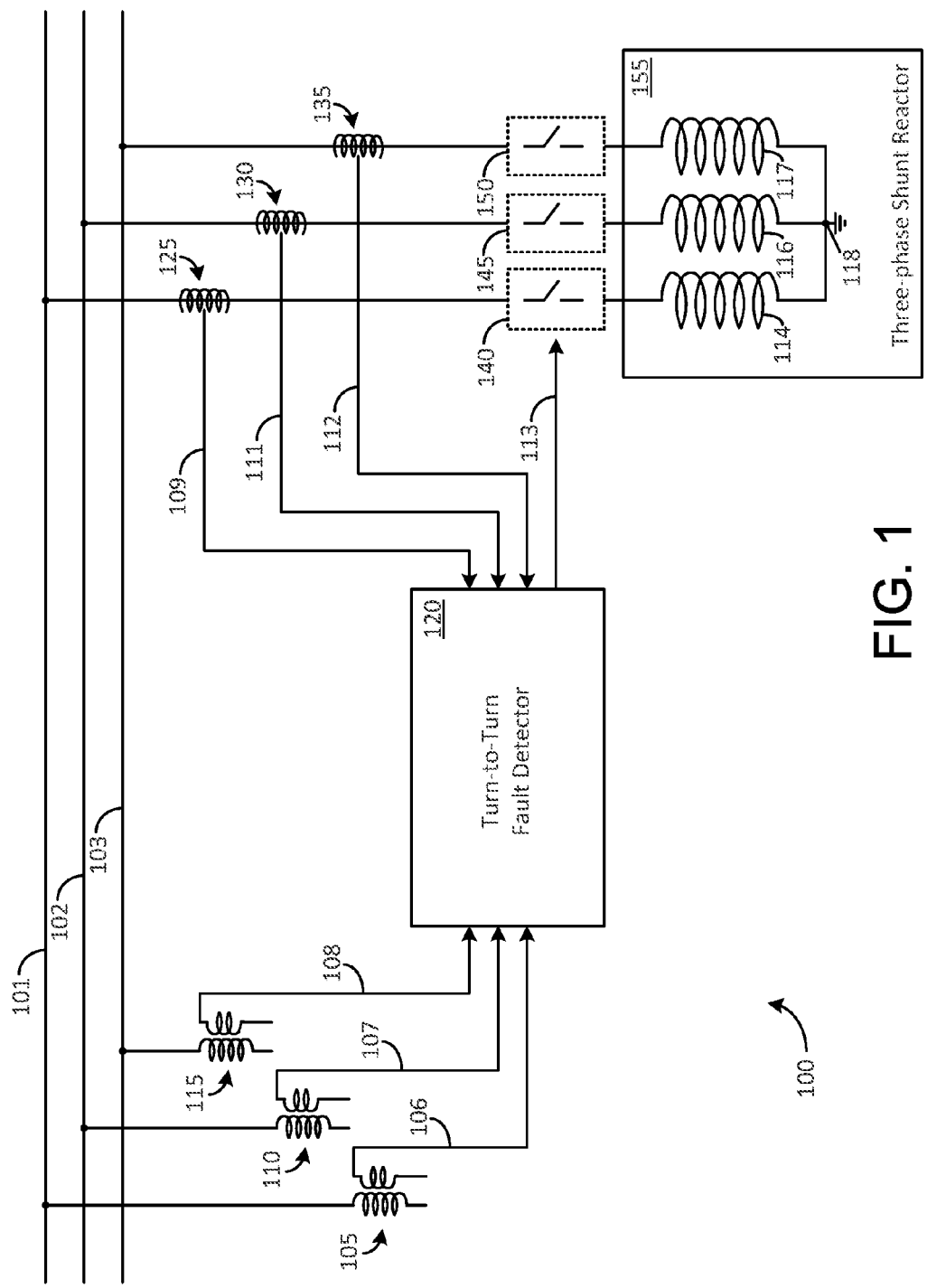

Having thus described the disclosure in general terms, reference will now be made to the accompanying drawings, which are not necessarily drawn to scale, and wherein:

FIG. 1 illustrates an example three-phase power line system that can include a turn-to-turn fault detector configured to detect one or more turn-to-turn faults in a three-phase shunt reactor in accordance with an exemplary embodiment of the disclosure.

Figure 2:
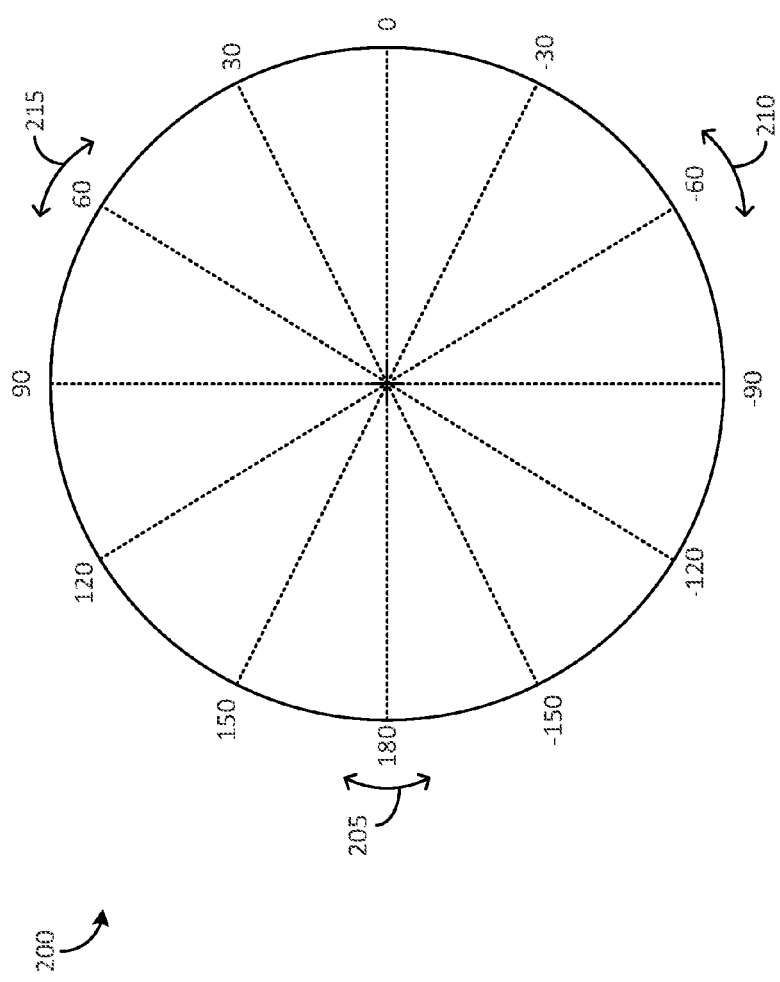

FIG. 2 illustrates an example phase diagram pertaining to detecting one or more turn-to-turn faults in the three-phase shunt reactor shown in FIG. 1 on the basis of phase angle information.

Figure 3:
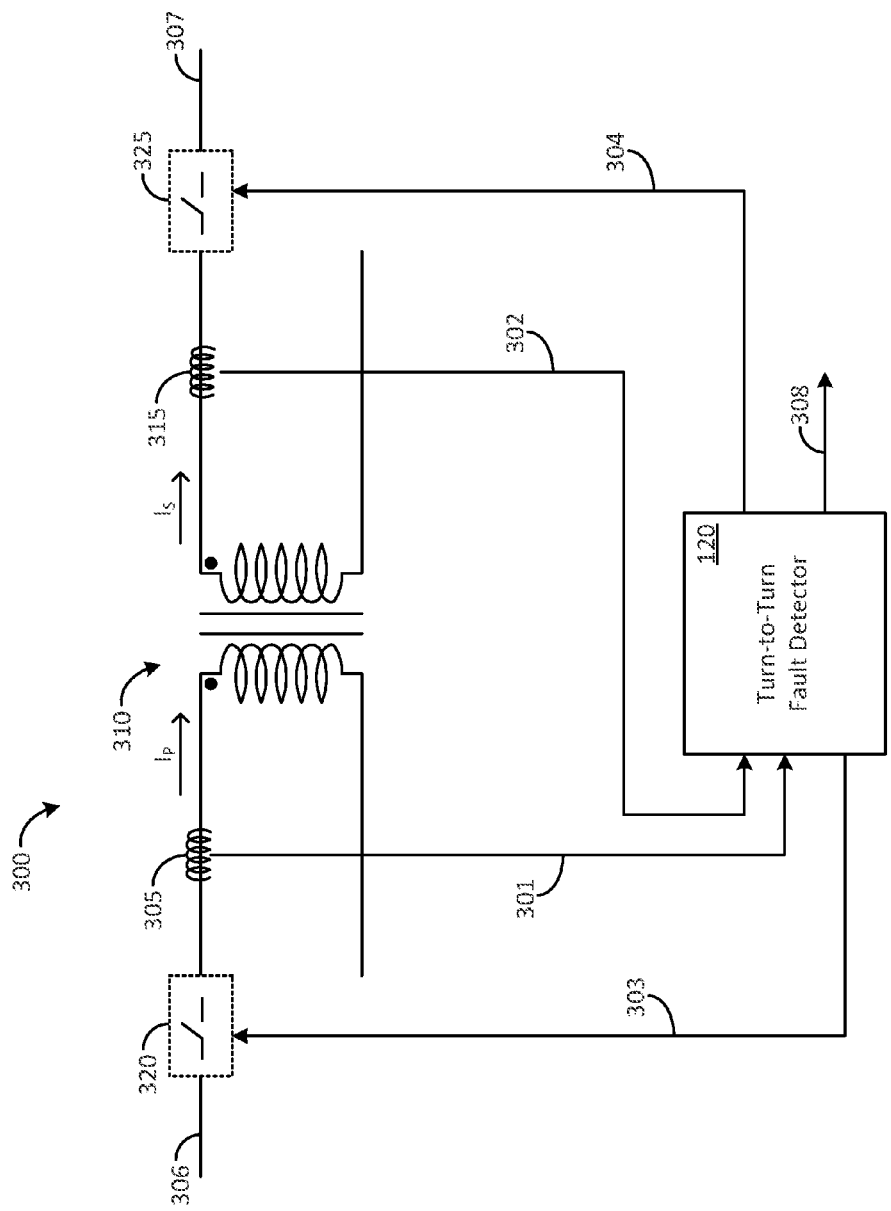

FIG. 3 illustrates an example power transmission system that can include a turn-to-turn fault detector system configured to detect a turn-to-turn fault in a single phase transformer in accordance with another exemplary embodiment of the disclosure.

Figure 4:
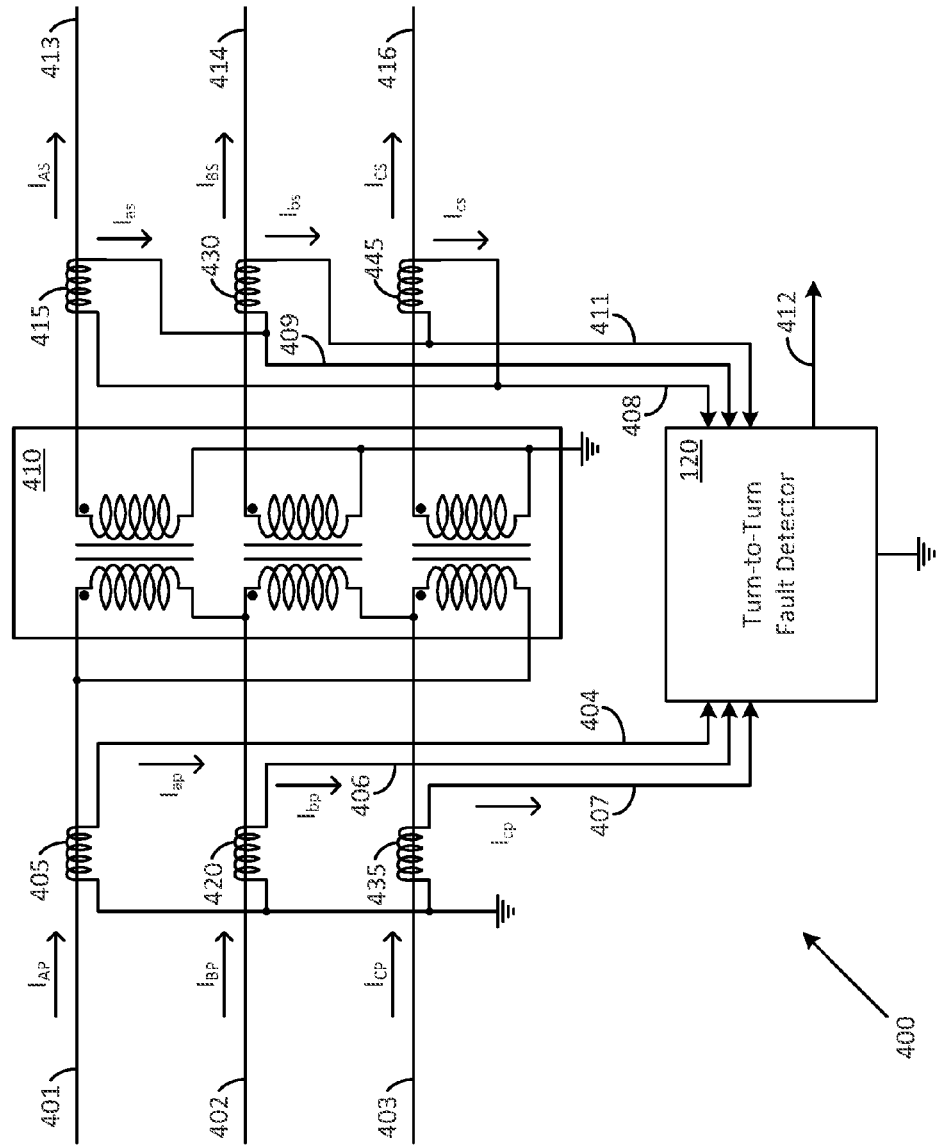

FIG. 4 illustrates an example power transmission system that can include a turn-to-turn fault detector system configured to detect a turn-to-turn fault in a three-phase transformer in accordance with another exemplary embodiment of the disclosure.

Figure 5:
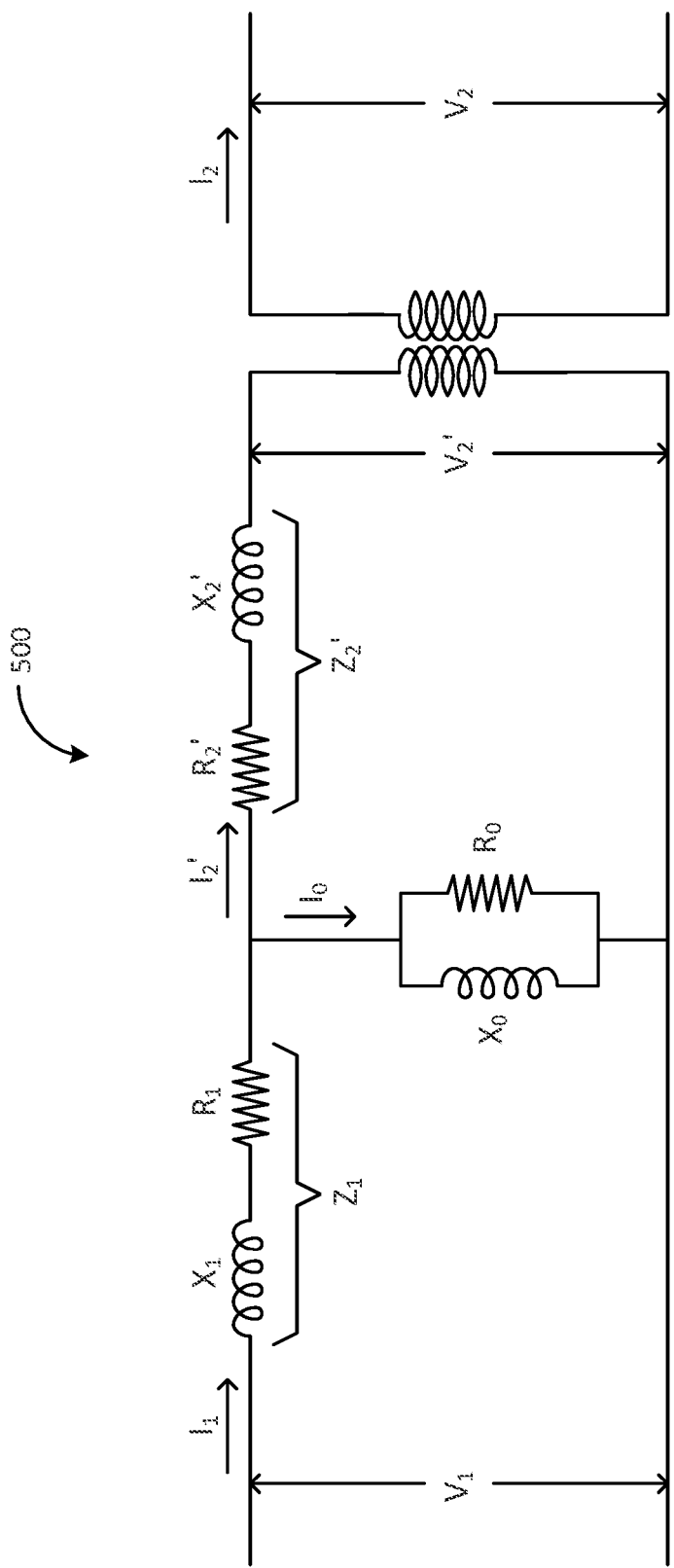

FIG. 5 illustrates an example equivalent circuit diagram applicable to each of the single phase transformers shown in FIG. 3 and the three-phase transformer shown in FIG. 4.

Figure 6:
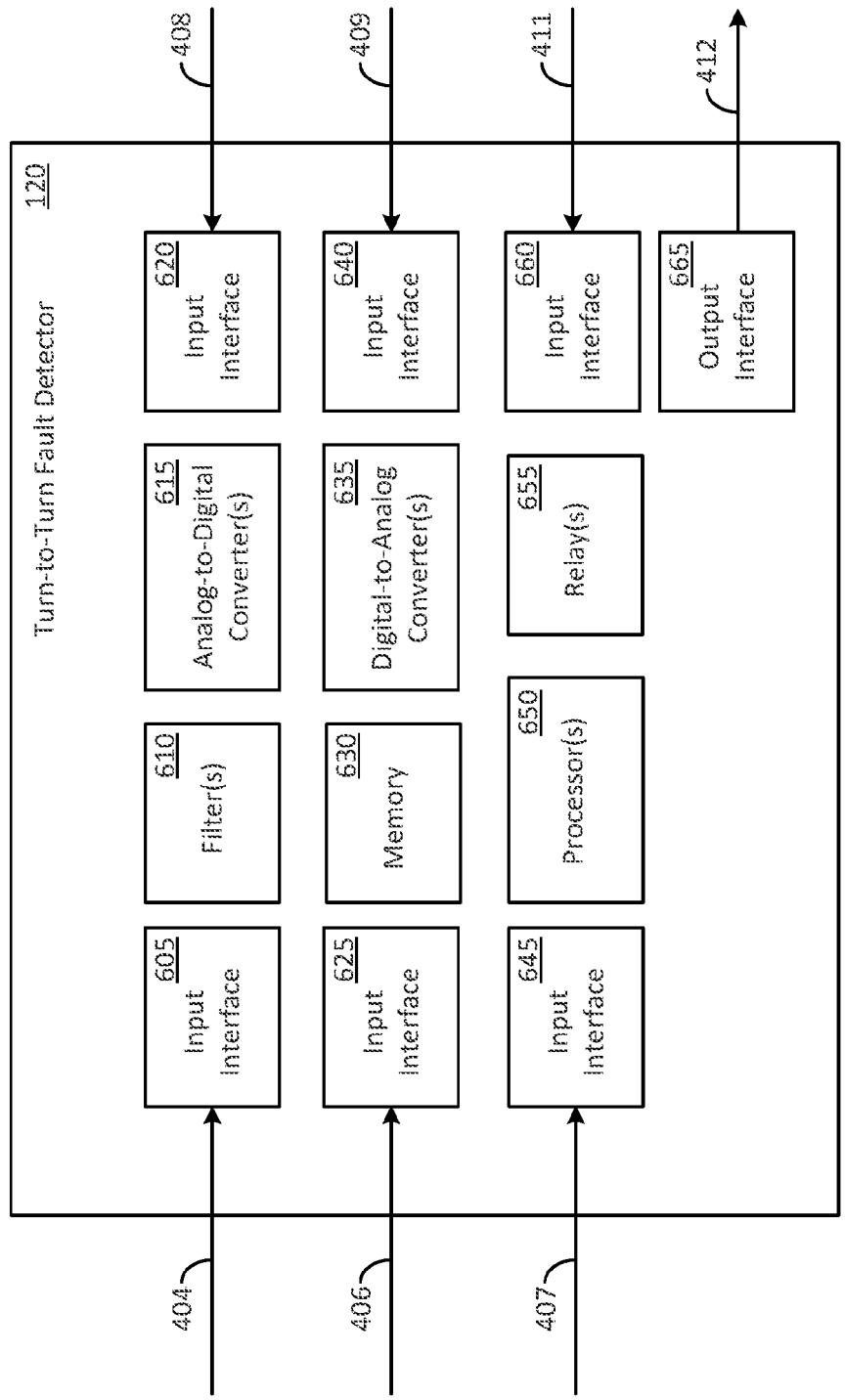

FIG. 6 illustrates an exemplary turn-to-turn fault detector in accordance with an exemplary embodiment of the disclosure.

Figure 7A:
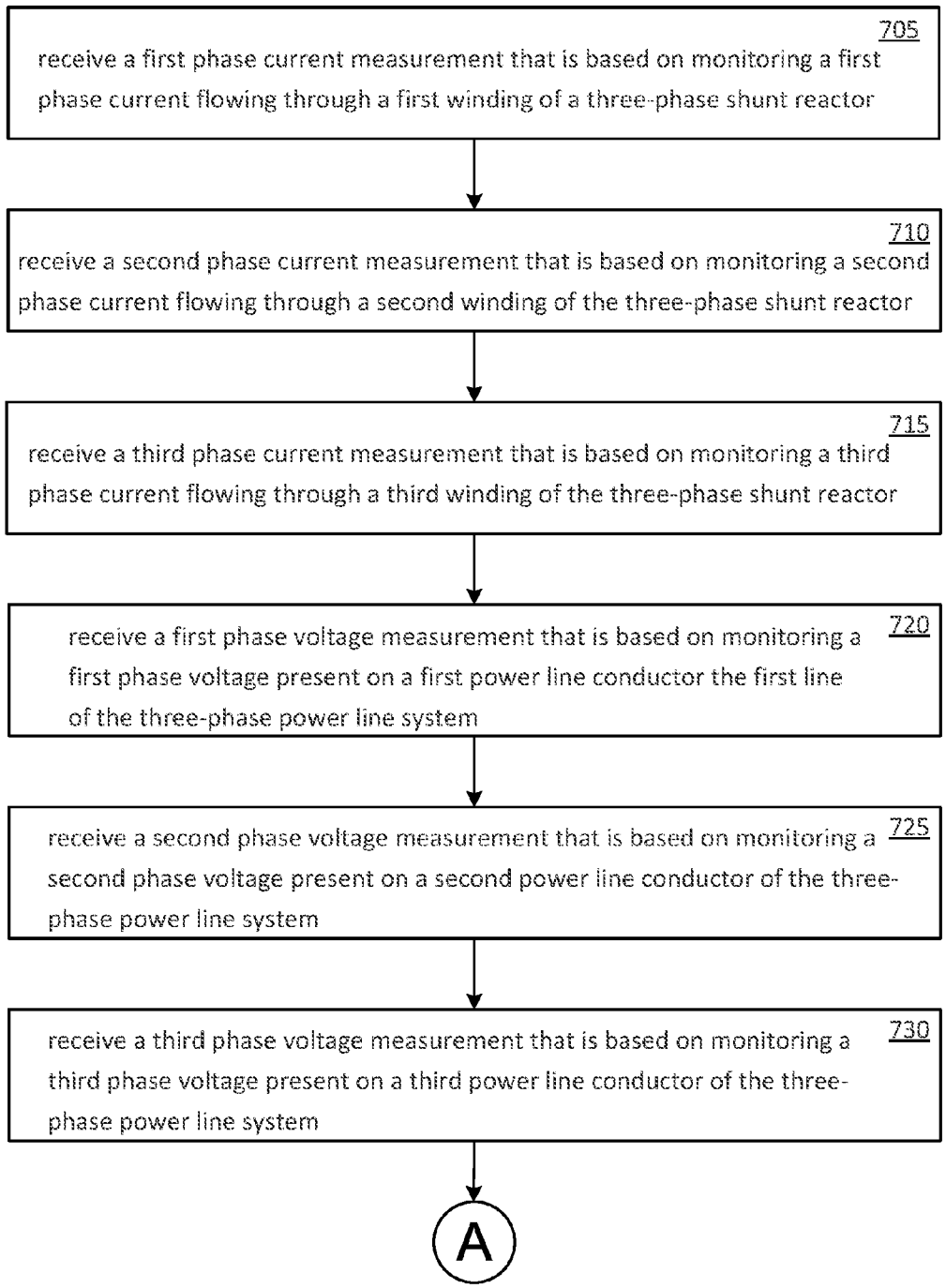

FIGS. 7A and 7B illustrate a flowchart of an example method of using a turn-to-turn fault detector to detect a fault in one or more windings of a three-phase shunt reactor in accordance with an exemplary embodiment of the disclosure.

Figure 8A:
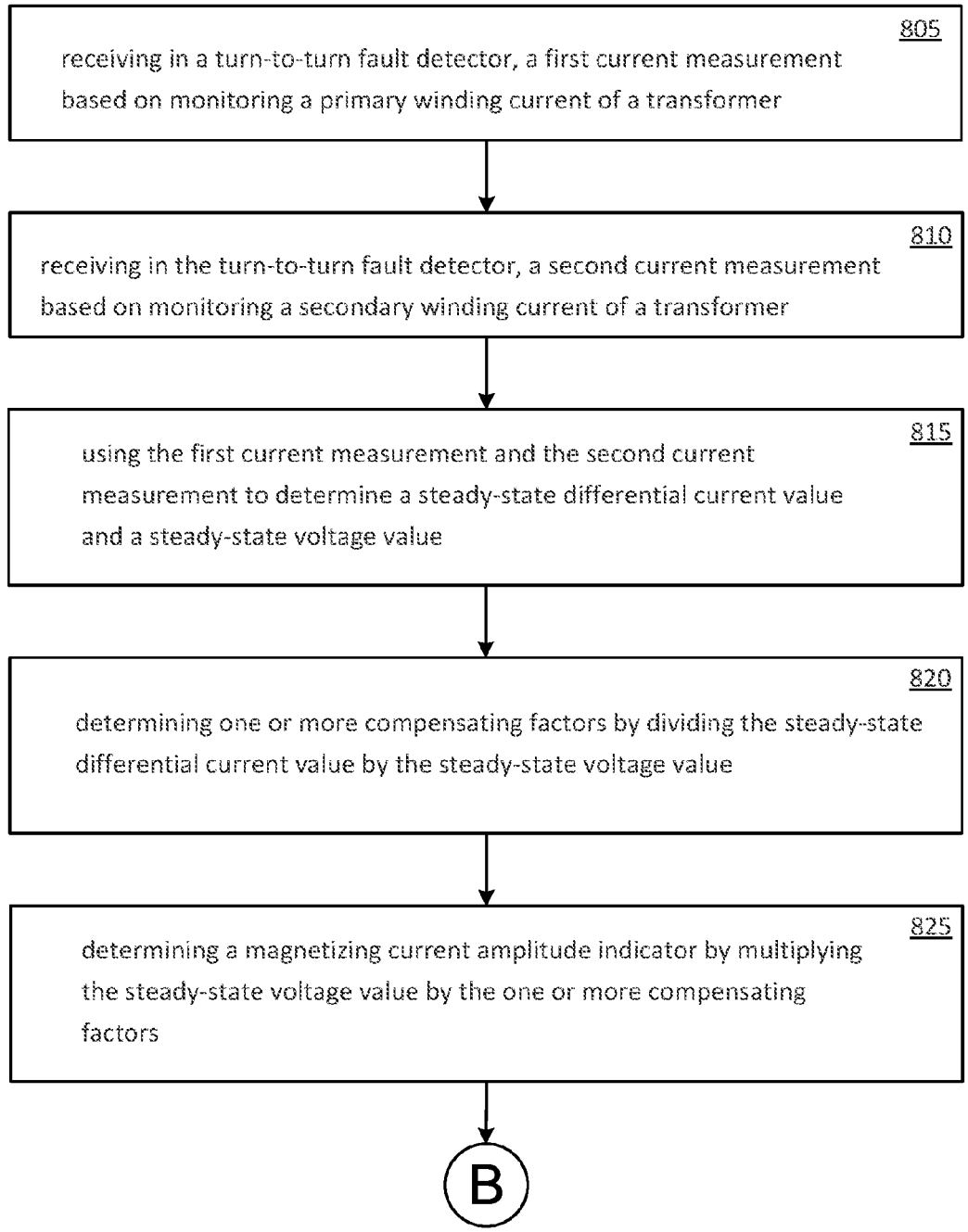
Figure 8B:
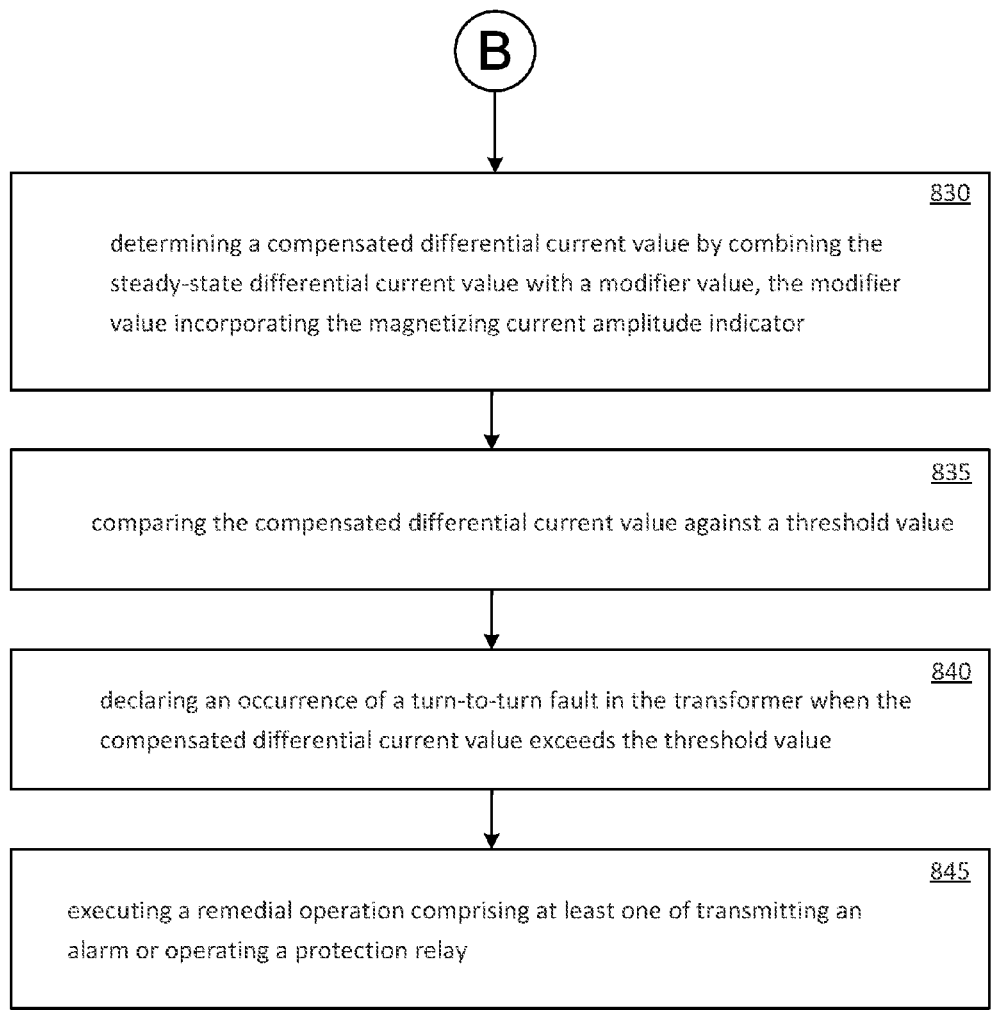

FIGS. 8A and 8B illustrate a flowchart of an example method of using a turn-to-turn fault detector to detect a turn-to-turn fault in one or more windings of a transformer in accordance with another exemplary embodiment of the disclosure.

DETAILED DESCRIPTION OF THE DISCLOSURE

The disclosure will be described more fully hereinafter with reference to the accompanying drawings, in which exemplary embodiments of the disclosure are shown. This disclosure may, however, be embodied in many different forms and should not be construed as limited to the exemplary embodiments set forth herein; rather, these embodiments are provided so that this disclosure will satisfy applicable legal requirements. Like numbers refer to like elements throughout. It should be understood that certain words and terms are used herein solely for convenience and such words and terms should be interpreted as referring to various objects and actions that are generally understood in various forms and equivalencies by persons of ordinary skill in the art. For example, it should be understood that the word "line" as used herein generally refers to an electrical conductor, for example, a wire or an electrical power cable. Furthermore, the word "example" as used herein is intended to be non-exclusionary and non-limiting in nature. More particularly, the word "exemplary" as used herein indicates one among several examples, and it should be understood that no undue emphasis or preference is being directed to the particular example being described.

In terms of a general overview, certain embodiments of the systems and methods described herein are directed to a fault detector that can be used to detect one or more turn-to-turn faults in a coil winding. As is known, coil windings are ubiquitously incorporated into a wide array of products. However, in the interest of brevity, only two products, specifically a three-phase shunt reactor and a power transformer, are used herein to describe various embodiments and aspects in accordance with the disclosure.

Attention is first drawn to FIG. 1, which illustrates an example three-phase power line system 100 that can include a turn-to-turn fault detector 120 configured to detect one or more turn-to-turn faults in a three-phase shunt reactor 155 in accordance with an exemplary embodiment of the disclosure. Three-phase power line system 100 can be used to propagate electric power over three power lines 101, 102, and 103 in a three-phase configuration as is known in the art. Each of the three power lines 101, 102, and 103 can be coupled to the three-phase shunt reactor 155 that is deployed in a manner that is known in the art. The three-phase shunt reactor 155 can include three windings that are collectively coupled to ground via a node 118. A first winding 114 of the three windings in the three-phase shunt reactor 155 is coupled to the power line 101 via a first current monitoring element 125 and a first isolating switch 140. The first isolating switch 140, which is an exemplary protection element, can be controlled by the turn-to-turn fault detector 120 via a control line 113 in order to isolate the first winding 114 from the power line 101 when a turn-to-turn fault is detected in the first winding 114. A second winding 116 of the three windings in the three-phase shunt reactor 155 is coupled to the power line 102 via a second current monitoring element 130 and a second isolating switch 145. The second isolating switch 145 can be controlled by the turn-to-turn fault detector 120 via the control line 113 (or via a separate control line that is not shown) in order to isolate the second winding 116 from the power line 102 when a turn-to-turn fault is detected in the second winding 116. A third winding 117 of the three windings in the three-phase shunt reactor 155 is coupled to the power line 103 via a third current monitoring element 135 and a third isolating switch 150. The third isolating switch 150 can be controlled by the turn-to-turn fault detector 120, via the control line 113 (or via a separate control line that is not shown) in order to isolate the third winding 117 from the power line 103 when a turn-to-turn fault is detected in the third winding 117. It should be understood that more than one of the three optional switches 140, 145, and 150 (each of which can be implemented in the form of a relay, for example) can be operated by the turn-to-turn fault detector 120 when one or more turn-to-turn faults are detected in one or more of the three windings 114, 116, and 117. Furthermore, in place of using the three isolating switches, other protection elements and configurations can be used to provide remedial action upon detecting one or more turn-to-turn faults in one or more of the three windings 114, 116, and 117.

The first current monitoring element 125 can be used to monitor the power line 101 and to output a current measurement that is a scaled-down version of a first phase current that is routed from the power line 101 into the first winding 114 of the three-phase shunt reactor 155 when three-phase electric power is being transmitted through the three-phase power line system 100. The current measurement output of the current monitoring element 125 is coupled into the turn-to-turn fault detector 120 via a line 109. The second current monitoring element 130 can be similarly used to monitor the power line 102 and to output a current measurement that is a scaled-down version of a second phase current that is routed from the power line 102 to the second winding 116 of the three-phase shunt reactor 155 when three-phase electric power is being transmitted through the three-phase power line system 100. The current measurement output of the current monitoring element 130 is coupled into the turn-to-turn fault detector 120 via a line 111. The third current monitoring element 135 can also be similarly used to monitor the power line 103 and to output a current measurement that is a scaled-down version of a third phase current that is routed from the power line 103 to the third winding 117 of the three-phase shunt reactor 155 when three-phase electric power is being transmitted through the three-phase power line system 100. The current measurement output of the current monitoring element 135 is coupled into the turn-to-turn fault detector 120 via a line 112.

With further reference to the three-phase shunt reactor 155, in an exemplary embodiment in accordance with the disclosure, the three windings 114, 116, and 117 can be collectively contained within a single enclosure. Furthermore, the three windings 114, 116, and 117 can be provided in various configurations such as, for example, a Δ configuration or a wye configuration. In another exemplary embodiment in accordance with the disclosure, each of the three windings 114, 116, and 117 can be contained in three separate enclosures. In yet another exemplary embodiment in accordance with the disclosure, two or more of the three windings 114, 116, and 117 can be contained in a second enclosure that is different than a first enclosure in which the remaining of the three windings 114, 116, and 117 is contained. In yet another exemplary embodiment in accordance with the disclosure, one or more additional windings can be provided in addition to the three windings 114, 116, and 117. For example, a fourth winding can be coupled between the node 118 and ground. The turn-to-fault detector 120 can be used to detect one or more turn-to-turn faults in one or more of these various windings in accordance with the disclosure.

Turning now to other monitoring elements in the three-phase power line system 100, a first voltage monitoring element 105 can be used to monitor the power line 101 and to output a voltage measurement that is a scaled-down version of a first phase voltage present on the power line 101 when three-phase electric power is transmitted through the three-phase power line system 100. The voltage measurement output of the voltage monitoring element 105 is coupled into the turn-to-turn fault detector 120 via a line 106. A second voltage monitoring element 115 can be used to monitor the power line 102 and to output a voltage measurement that is a scaled-down version of a second phase voltage present on the power line 102 when three-phase electric power is transmitted through the three-phase power line system 100. The voltage measurement output of the voltage monitoring element 110 is coupled into the turn-to-turn fault detector 120 via a line 107. A third voltage monitoring element 115 can be used to monitor the power line 103 and to output a voltage measurement that is a scaled-down version of a third phase voltage present on the power line 103 when three-phase electric power is transmitted through the three-phase power line system 100. The voltage measurement output of the voltage monitoring element 115 is coupled into the turn-to-turn fault detector 120 via a line 108.

The turn-to-turn fault detector 120 includes various elements that will be described below in more detail using another figure. Operatively, the turn-to-turn fault detector 120 is configured to execute a procedure that uses a differential protection algorithm to detect one or more turn-to-turn faults in one or more windings of the three-phase shunt reactor 155. In one example implementation, the procedure includes using the voltage measurements provided by the voltage monitoring elements 105, 110, and 115, and the current measurements provided by the current monitoring elements 125, 130, and 135 to calculate a difference value between a voltage-based parameter and a current-based parameter. The voltage-based parameter is indicative of a normalized negative voltage imbalance and the current-based parameter is indicative of a normalized negative current imbalance. The procedure further includes declaring an occurrence of the turn-to-turn fault in at least one of the first winding 114, the second winding 116, or the third winding 117 of the three-phase shunt reactor 155 when the difference value is not equal to zero. The difference value is approximately zero under steady state conditions and no turn-to-turn fault is present in the three windings 114, 116, and 117. Any small deviation from zero can be attributed to minor system imbalances that may be present under normal operating conditions of the three-phase power line system 100. In some exemplary implementations, the occurrence of the turn-to-turn fault can be declared only when the difference value exceeds a threshold value.

Significantly, and in contrast to conventional turn-to-turn fault detection systems, the turn-to-turn fault detector 120 can be used to identify a specific faulty phase among the various phases of a target object, for example, among the three phases in the three-phase power line system 100. Also, the turn-to-turn fault detector 120 can be used to identify turn-to-turn faults in various types of windings without requiring impedance information of the windings (for example, impedance information pertaining to any of the three windings 114, 116, and 117) and without requiring information pertaining to a current flow through a neutral winding (not shown) of the three-phase shunt reactor 155.

Furthermore, the turn-to-turn fault detector 120 can provide a satisfactory level of performance under various operational conditions of the three-phase power line system 100, for example, under normal system unbalances, off-nominal system frequencies, off-nominal system voltages, during load switching, in the presence of harmonics, and in the presence of faults external to the three-phase shunt reactor 155. However, in one example implementation, the turn-to-turn fault detector 120 is configured to avoid using the differential protection algorithm when one or more of the current monitoring elements 125, 130, and 135 undergo one or more of a current saturation condition, a current inrush condition, or an offline condition.

Details pertaining to the differential protection algorithm used by the turn-to-turn fault detector 120 to detect one or more turn-to-turn faults in one or more windings of the three-phase shunt reactor 155 can be further understood in view of the following description based on mathematical equations in accordance with the disclosure.

$$I_A = V_A/Z_A;\ I_B = V_B/Z_B;\ I_C = V_C/Z_C; \quad \text{Equation (1)}$$

$$V_{Neg\_Unbal\_Normalized} = (V_2/V_1) \times 100\% \quad \text{Equation (2)}$$

$$I_{Neg\_Unbal\_Normalized} = (I_2/I_1) \times 100\% \quad \text{Equation (3)}$$

$$I_{Neg\_Unbal\_Normalized} = (I_A + a^2 I_B + a I_C)/(I_A + a I_B + a^2 I_C) \times 100\% = [V_A/Z_A + a^2(V_B/Z_B) + a(V_C/Z_C)]/[V_A/Z_A + a(V_B/Z_B) + a^2(V_C/Z_C)] \times 100\% \quad \text{Equation (4)}$$

where $V_A$, $V_B$, and $V_C$ are phase voltage measurements provided to the turn-to-turn detector 120 by the voltage monitoring elements 105, 110, and 115 respectively; $I_A$, $I_B$, and $I_C$ are phase current measurements provided to the turn-to-turn detector 120 by the current monitoring elements 125, 130, and 135; $Z_A$, $Z_B$, and $Z_C$ are phase impedances of the three windings 114, 116, and 117 of the three-phase shunt reactor 155; $V_2$ and $V_1$ are negative sequence and positive sequence voltages respectively; and $I_2$ and $I_1$ are negative sequence and positive sequence currents respectively. The operator "a" is defined as a unit vector at an angle of 120 degrees, and can be described as "a"=1∠120 degrees.

The three windings 114, 116, and 117 of the three-phase shunt reactor 155 are typically identical to one another and have a symmetrical arrangement. Consequently, when the three-phase power line system 100 is operating in a steady state, $Z_A = Z_B = Z_C = Z$. Thus, from equations (1) through (4), it can be understood that:

$$I_{Neg\_Unbal\_Normalized} = [V_A/Z + a^2(V_B/Z) + a(V_C/Z)]/[V_A/Z + a(V_B/Z) + a^2(V_C/Z)] \times 100\% = (V_A + a^2 V_B + a V_C)/(V_A + a V_B + a^2 V_C) \times 100\% = (V_2/V_1) \times 100\% = V_{Neg\_Unbal\_Normalized} \quad \text{Equation (5)}$$

where $V_{Neg\_Unbal\_Normalized}$ and $I_{Neg\_Unbal\_Normalized}$ are unit-less complex quantities expressed in a percentage form.

A difference value can now be defined in the form of a variable "Diff" as follows:

$$\text{Diff} = V_{Neg\_Unbal\_Normalized} - I_{Neg\_Unbal\_Normalized} \quad \text{Equation (6)}$$

Because $Z_A = Z_B = Z_C = Z$ during steady state operation, $$\text{Diff}_{steady} = 0 \text{ or } \text{Diff}_{steady} \approx 0 \quad \text{Equation (7)}$$

When a turn-to-turn faults is present in one of the three windings 114, 116, and 117 of the three-phase shunt reactor 155, an impedance of the winding having the turn-to-turn fault changes, thereby resulting in:

$$V_{Neg\_Unbal\_Normalized} - I_{Neg\_Unbal\_Normalized} = \text{Diff} \quad \text{Equation (8)}$$

An absolute value of the difference parameter (Diff) can be used by the turn-to-turn fault detector 120 to declare a fault condition. In one example implementation, a fault condition can be declared when the absolute value of the difference parameter (Diff) exceeds a threshold percentage value "c." The threshold percentage value "c" can be a settable threshold value that can be set by an operator of the turn-to-turn fault detector 120.

$$\text{Fault condition} = \text{abs}(\text{Diff} - \text{Diff}_{steady}) > c \quad \text{Equation (9)}$$

A fault condition can also be declared by examining vector representations of phases associated with each of the voltages $V_A$, $V_B$, and $V_C$. In one exemplary embodiment, this can be carried out by using the expression ∠(Diff−$\text{Diff}_{steady}$). A faulty "phase A" may be declared when ∠(Diff−$\text{Diff}_{steady}$) is in a range of 180°±D, a faulty "phase B" may be declared when ∠(Diff−$\text{Diff}_{steady}$) is in a range of −60°±D, and a faulty "phase C" may be declared when ∠(Diff−$\text{Diff}_{steady}$) is in a range of +60 degrees±D, where "D" is a limit angle that can be set in a range of 20° to 60°.

FIG. 2 illustrates an example phase diagram 200 pertaining to detecting one or more turn-to-turn faults in the three-phase shunt reactor 155 on the basis of phase angle information. The range of 180 degrees±D corresponding to "phase A" is indicated by an arrow 205, the range of −60 degrees±D corresponding to "phase B" is indicated by an arrow 210, and the range of +60 degrees±D corresponding to "phase C" is indicated by an arrow 215. The turn-to-turn fault detector 120 can be configured to declare a fault in a particular phase among the three phases A, B, and C by employing the three ranges shown in the example phase diagram 200.

FIG. 3 illustrates an example power transmission system 300 that can include a turn-to-turn fault detector system 120 configured to detect a turn-to-turn fault in the primary and secondary windings of a single phase transformer 310 in accordance with another exemplary embodiment of the disclosure. A first current monitoring element 305 can be used to monitor a primary current "$I_P$" that flows via line 306 and into a primary winding of the single phase transformer 310. The first current monitoring element 305 provides a scaled-down version of the primary current to the turn-to-turn fault detector 120 via a line 301. A second current monitoring element 315 can be used to monitor a secondary current "$I_S$" that flows out to a line 307 from a secondary winding of the single phase transformer 310. The second current monitoring element 315 provides a scaled-down version of the secondary current to the turn-to-turn fault detector 120 via a line 302. Additional monitoring elements (not shown) can be used for monitoring voltages at various nodes of the power transmission system 300, such as, for example, to provide the turn-to-turn fault detector 120 with one or more steady-state voltage values or differential voltage values associated with the primary winding and the secondary winding of the single phase transformer 310.

In this exemplary embodiment, the turn-to-turn fault detector 120 is configured to execute a procedure that includes using the current values and the voltage values obtained via the various monitoring elements to determine various steady-state differential currents and various steady-state voltage values. Each of the steady-state differential currents typically includes a steady-state magnetizing current component that is dependent upon at least one steady-state voltage that is present at a terminal of the single phase transformer 310.

In accordance with this disclosure, and in contrast to conventional implementations, one or more compensating factors (in the form of one or more modifier values) are combined with the various steady-state differential current values to compensate for the steady-state magnetizing current component and also to compensate for any measurement errors in the steady-state differential current values. In one example implementation, a modifier value that is equal to a magnetizing current component value can be used. The modifier value may be subtracted from a steady-state differential current value to provide the compensation.

The compensated steady-state differential current value can then be used to detect a turn-to-turn fault, such as, for example, by comparing a compensated steady-state differential current value against a reference threshold value. The comparing may be carried out over a pre-settable period of time that can be pre-set by an operator, for example.

Upon detection of a turn-to-turn fault, the turn-to-turn fault detector 120 can carry out a remedial action. For example, the turn-to-turn fault detector 120 can provide a first control signal (via a line 303) to a first protection element 320 (a relay, for example) in order to isolate the primary winding of the single phase transformer 310 from the power line conductor 306. As another example, the turn-to-turn fault detector 120 can provide a second control signal (via a line 304) to a second protection element 325 (another relay, for example) in order to isolate the secondary winding of the single phase transformer 310 from the power line conductor 307. The turn-to-turn fault detector 120 can also provide a fault indicator signal via a line 308, to a fault monitoring unit (not shown) such as, for example, a computer that is located at a monitoring station, a display device located at the monitoring station, or an alarm (light, buzzer, siren etc.) located on or near the turn-to-turn fault detector 120.

FIG. 4 illustrates a power transmission system 400 that can include a turn-to-turn fault detector system 120 configured to detect a turn-to-turn fault in a three-phase transformer 410 in accordance with another exemplary embodiment of the disclosure. In this other exemplary embodiment, the three-phase transformer 410 is shown with three primary windings interconnected in a "Δ" arrangement and three secondary windings interconnected in a "Y" arrangement, solely as a matter of convenience for purposes of description. However, it should be understood that the description provided below in accordance with the disclosure, is equally applicable to various other configurations and interconnections associated with the three three-phase transformer 410.

A first current monitoring element 405 can be used to monitor a phase "A" primary current "$I_{AP}$" that flows via line 401 into a first primary winding of the three-phase transformer 410. The first current monitoring element 405 provides to the turn-to-turn fault detector 120, via a line 404, a scaled-down version "$I_{ap}$" of the primary current "$I_{AP}$." A second current monitoring element 420 can be used to monitor a phase "B" primary current "$I_{BP}$" that flows via line 402 into a second primary winding of the three-phase transformer 410. The second current monitoring element 420 provides to the turn-to-turn fault detector 120, via a line 406, a scaled-down version "$I_{bp}$" of the primary current "$I_{BP}$." A third current monitoring element 435 can be used to monitor a phase "C" primary current "$I_{CP}$" that flows via line 403 into a third primary winding of the three-phase transformer 410. The third current monitoring element 435 provides to the turn-to-turn fault detector 120, via a line 407, a scaled-down version "$I_{cp}$" of the primary current "$I_{CP}$."

A fourth current monitoring element 415 can be used to monitor a phase "A" secondary current "$I_{AS}$" that is provided by a first secondary winding of the three-phase transformer 410 to a line 413. The fourth current monitoring element 415 provides to the turn-to-turn fault detector 120, a first secondary current measurement "$I_{as}$" that is a scaled-down version of "$I_{AS}$." A fifth current monitoring element 430 can be used to monitor a phase "B" secondary current "$I_{BS}$" that is provided by a second secondary winding of the three-phase transformer 410 to a line 414. The fifth current monitoring element 430 provides to the turn-to-turn fault detector 120, a second secondary current measurement "$I_{bs}$" that is a scaled-down version of "$I_{BS}$." A sixth current monitoring element 445 can be used to monitor a phase "C" secondary current "$I_{CS}$" that is provided by a third secondary winding of the three-phase transformer 410 to a line 416. The sixth current monitoring element 445 provides to the turn-to-turn fault detector 120, a third secondary current measurement "$I_{cs}$" that is a scaled-down version of "$I_{CS}$." In this exemplary embodiment, the three secondary current measurements ("$I_{as}$," "$I_{bs}$," and "$I_{cs}$") are coupled into the turn-to-turn fault detector 120 via a line arrangement that includes line 408, line 409, and line 411.

Additional monitoring elements (not shown) can be used for monitoring voltages at various nodes of the power transmission system 400, for example, to provide the turn-to-turn fault detector 120 with one or more steady-state voltage values or differential voltage values associated with one or more of the three primary windings and the three secondary windings of the three-phase transformer 410.

The turn-to-turn fault detector 120 is configured to execute a procedure that includes using the current values and the voltage values obtained via the various monitoring elements described above to determine various steady-state differential currents and various steady-state voltage values. This procedure can be understood in view of the procedure described above with reference to FIG. 3 and further in view of the following description based on mathematical equations in accordance with the disclosure.

$$Idiff\_A\_compensated = Idiff\_A - KA*V_{RA} \quad \text{Equation (10)}$$

$$Idiff\_B\_compensated = Idiff\_B - KA*V_{RB} \quad \text{Equation (11)}$$

$$Idiff\_C\_compensated = Idiff\_C - KA*V_{RC} \quad \text{Equation (12)}$$

where $V_{RA}$, $V_{RB}$, and $V_{RC}$ are the phase A, phase B, and phase C voltages on the output side of the three-phase transformer 410. However, in alternative implementations, the phase A, phase B, and phase C voltages on the input side of the three-phase transformer 410 can be used instead. KA, KB, and KC are coefficients that are used during a steady state operation of the three-phase transformer 410 in order to make each of Idiff_A_compensated, Idiff_B_compensated, and Idiff_C_compensated equal to zero. One or more of each of Idiff_A_compensated, Idiff_B_compensated, and Idiff_C_compensated will increase to a value greater than zero when a turn-to-fault exists in one or more of the respective windings. The coefficients KA, KB, and KC can be defined as follows:

$$KA = Idiff\_A\_steady / V_{RA}\ steady \quad \text{Equation (13)}$$

$$KB = Idiff\_A\_steady / V_{RB}\ steady \quad \text{Equation (14)}$$

$$KC = Idiff\_A\_steady / V_{RC}\ steady \quad \text{Equation (15)}$$

An absolute value of each of Idiff_A_compensated, Idiff_B_compensated, and Idiff_C_compensated can be used by the turn-to-turn fault detector 120 to declare a fault condition in a respective phase of the three-phase transformer 410. In one example implementation, a fault condition can be declared in phase A when the absolute value of Idiff_A_compensated exceeds (or equals) a threshold percentage value "a," a fault condition can be declared in phase B when the absolute value of Idiff_B_compensated exceeds (or equals) a threshold percentage value "b," and a fault condition can be declared in phase C when the absolute value of Idiff_C_compensated exceeds (or equals) a threshold percentage value "c." In other words, a turn-to-turn fault condition in phase A is declared when abs(Idiff_A_compensated)≥"a," a turn-to-turn fault condition in phase B is declared when abs(Idiff_B_compensated)≥"b," and a turn-to-turn fault condition in phase C is declared when abs(Idiff_C_compensated)≥"c." The threshold percentage values "a," "b," and "c" can be settable threshold values that can be set, for example, by an operator of the turn-to-turn fault detector 120.

Upon detection of a turn-to-turn fault in the three-phase transformer 410, the turn-to-turn fault detector 120 can carry out a remedial action. For example, the turn-to-turn fault detector 120 can provide a control signal (via a line 412) to one or more protection elements (not shown) in order to isolate one or more of the primary windings from a respective one or more input lines, and/or to isolate one or more of the secondary windings from a respective one or more output lines. In some example implementations, the turn-to-turn fault detector 120 can provide a fault indicator signal via the line 412 to a fault monitoring unit (not shown) such as, for example, a computer that is located at a monitoring station, a display device located at the monitoring station, or an alarm (light, buzzer, siren etc.) located on or near the turn-to-turn fault detector 120.

FIG. 5 illustrates an example equivalent circuit diagram of the single phase transformer 310 shown in FIG. 3. The input current $I_1$ is equal to the output current $I_2$ (typically with a phase difference of 180°) if no loss were to be incurred in the single phase transformer 310. However, in practicality, a current loss does occur in the single phase transformer 310. This current loss can be attributed to a magnetizing current $I_0$ that is shown in the equivalent circuit diagram. The turn-to-turn fault detector 120 carries out a fault-to-fault detection by taking this magnetizing current $I_0$ into consideration in accordance with the disclosure.

FIG. 6 illustrates some exemplary elements that can be contained in the turn-to-turn fault detector 120 in accordance with the disclosure. For purposes of description, the turn-to-turn fault detector 120 shown in FIG. 6 contains various elements that can be used for implementing the exemplary embodiment shown in FIG. 4 and described above with respect to the three-phase transformer 410. Accordingly, the input lines and output lines are designated by the same reference numerals that are shown in FIG. 4. However, in other implementations, such as, for example, when implementing the single phase transformer 310 embodiment shown in FIG. 3, the number of various elements (such as, for example, the number of input interfaces) contained in the turn-to-turn fault detector 120 can be different.

In this exemplary implementation, the turn-to-turn fault detector 120 can include six input current interfaces 605, 625, 645, 620, 640 and 660 that are coupled to lines 404, 406, 407, 408, 409 and 411 respectively. Other input interfaces, such as for example voltage input interfaces (not shown) can be used for providing the turn-to-turn fault detector 120 with various kinds of voltage measurement inputs. The turn-to-turn fault detector 120 can also include one or more output interfaces (such as an output interface 665 that is shown coupled to the line 412), for purposes of transmitting output signals such as a control signal, a fault indication signal, or an alarm signal.

The turn-to-turn fault detector 120 can further include one or more analog-to-digital converters and digital-to-analog converters. For example, the analog-to-digital converter 615 can be used to convert a current measurement provided by one of the input interfaces in an analog form into a digital current measurement value that can be processed by the processor 650. Conversely, the digital-to-analog converter 635 can be used to convert various types of digital information that can be provided by the processor 650 to the digital-to-analog converter 635, into an analog output signal that is transmitted out of the turn-to-turn fault detector 120 via the output interface 665. One or more relays, such as a relay 655, can be used for switching various types of signals (such as, for example, certain current signals associated with the power transmission system 400) when a turn-to-turn fault is detected in the three-phase transformer 410.

One or more processors, such as the processor 650, can be configured to interact with a memory 630. The processor 650 can be implemented and operated using appropriate hardware, software, firmware, or combinations thereof. Software or firmware implementations can include computer-executable or machine-executable instructions written in any suitable programming language to perform the various functions described. In one embodiment, instructions associated with a function block language can be stored in the memory 630 and executed by the processor 650.

The memory 630 can be used to store program instructions that are loadable and executable by the processor 650, as well as to store data generated during the execution of these programs. Depending on the configuration and type of the turn-to-turn fault detector 120, the memory 630 can be volatile (such as random access memory (RAM)) and/or non-volatile (such as read-only memory (ROM), flash memory, etc.). In some embodiments, the memory devices can also include additional removable storage (not shown) and/or non-removable storage (not shown) including, but not limited to, magnetic storage, optical disks, and/or tape storage. The disk drives and their associated computer-readable media can provide non-volatile storage of computer-readable instructions, data structures, program modules, and other data. In some implementations, the memory 630 can include multiple different types of memory, such as static random access memory (SRAM), dynamic random access memory (DRAM), or ROM.

The memory 630, the removable storage, and the non-removable storage are all examples of non-transient computer-readable storage media. Such non-transient computer-readable storage media can be implemented in any method or technology for storage of information such as computer-readable instructions, data structures, program modules or other data. Additional types of non-transient computer storage media that can be present include, but are not limited to, programmable random access memory (PRAM), SRAM, DRAM, ROM, electrically erasable programmable read-only memory (EEPROM), compact disc read-only memory (CD-ROM), digital versatile discs (DVD) or other optical storage, magnetic cassettes, magnetic tapes, magnetic disk storage or other magnetic storage devices, or any other medium which can be used to store the desired information and which can be accessed by the processor 650. Combinations of any of the above should also be included within the scope of non-transient computer-readable media.

Turning to the contents of the memory 630, the memory 630 can include, but is not limited to, an operating system (OS) and one or more application programs or services for implementing the features and aspects disclosed herein. Such applications or services can include a turn-to-turn fault detection module (not shown). In one embodiment, the turn-to-turn fault detection module can be implemented by software that is provided in configurable control block language and is stored in non-volatile memory. When executed by the processor 650, the performance turn-to-turn fault detection module implements the various functionalities and features described in this disclosure.

FIGS. 7A and 7B illustrate an example flowchart of a method of using a turn-to-turn fault detection to detect a fault in one or more windings of a three-phase shunt reactor in accordance with an exemplary embodiment of the disclosure. The three-phase power line system 100 shown in FIG. 1 will be used here solely as a matter of convenience to describe the various operations shown in this example flowchart.

In block 705, a first phase current measurement that is based on monitoring a first phase current flowing through a first winding of the three-phase shunt reactor is received. This operation can correspond to the turn-to-turn fault detector 120 receiving the first phase current measurement via line 109 from the first current monitoring element 125.

In block 710, a second phase current measurement that is based on monitoring a second phase current flowing through a second winding of the three-phase shunt reactor is received. This operation can correspond to the turn-to-turn fault detector 120 receiving the second phase current measurement via line 111 from the second current monitoring element 130.

In block 715, a third phase current measurement that is based on monitoring a third phase current flowing through a third winding of the three-phase shunt reactor is received. This operation can correspond to the turn-to-turn fault detector 120 receiving the third phase current measurement via line 112 from the third current monitoring element 135.

In block 720, a first phase voltage measurement that is based on monitoring a first phase voltage present on a first power line conductor of a three-phase power line system is received. This operation can correspond to the turn-to-turn fault detector 120 receiving the first phase voltage measurement via line 106 from the first voltage monitoring element 105.

In block 725, a second phase voltage measurement that is based on monitoring a second phase voltage present on a second power line conductor of a three-phase power line system is received. This operation can correspond to the turn-to-turn fault detector 120 receiving the second phase voltage measurement via line 107 from the second voltage monitoring element 110.

In block 730, a third phase voltage measurement that is based on monitoring a third phase voltage present on a third power line conductor of a three-phase power line system is received. This operation can correspond to the turn-to-turn fault detector 120 receiving the third phase voltage measurement via line 108 from the third voltage monitoring element 115.

In block 735, the turn-to-turn fault detector uses each of the first phase current measurement, the second phase current measurement, the third phase current measurement, the first phase voltage measurement, the second phase voltage measurement, and the third phase voltage measurement to detect the turn-to-turn fault in at least one of the first winding, the second winding, or the third winding of the three-phase shunt reactor. The detection is carried out by calculating a difference value between a voltage-based parameter and a current-based parameter, wherein the voltage-based parameter is indicative of a normalized negative voltage imbalance and the current-based parameter is indicative of a normalized negative current imbalance.

In block 740, the turn-to-turn fault detector declares the turn-to-turn fault in at least one of the first winding, the second winding, or the third winding of the three-phase shunt reactor when the difference value is not equal to zero.

FIGS. 8A and 8B illustrate an example flowchart of a method of using a turn-to-turn fault detection to detect a turn-to-turn fault in one or more windings of a transformer in accordance with an exemplary embodiment of the disclosure. The power transmission system 300 shown in FIG. 3 will be used solely as a matter of convenience to describe the various operations shown in this example flowchart. It should be however understood that the method can be suitably applied to detect a turn-to-turn fault in one or more windings of a multi-phase transformer such as the three-phase transformer 410 shown in FIG. 4.

In block 805, a first current measurement that is based on monitoring a primary winding of a transformer is received. This operation can correspond to the turn-to-turn fault detector 120 receiving the first current measurement via line 301 from the first current monitoring element 305.

In block 810, a second current measurement that is based on monitoring a secondary winding of a transformer is received. This operation can correspond to the turn-to-turn fault detector 120 receiving the second current measurement via line 302 from the second current monitoring element 315. In block 815, each of the first current measurement and the second current measurement is used to determine a steady-state differential current value and a steady-state voltage value. In block 820, one or more compensating factors are determined by dividing the steady-state differential current value by the steady-state voltage value. In block 825, a magnetizing current amplitude indicator is determined by multiplying the steady-state voltage value with the compensating factor. In block 830, a compensated differential current value is determined by combining the steady-state differential current value with a modifier value, the modifier value incorporating the magnetizing current amplitude indicator. In block 835, the compensated differential current value is compared against a threshold value. In block 840, an occurrence of a turn-to-turn fault in the transformer is declared when the compensated differential current value exceeds the threshold value. In block 845, a remedial operation comprising at least one of transmitting an alarm or operating a protection relay is executed. For example, the turn-to-turn fault detector 120 can activate the first protection element 320 and/or the second protection element 325.

In summary, the systems and methods disclosed herein for detecting turn-to-turn faults are not limited exclusively to a three-phase shunt reactor as embodied in the accompanying claims, but are equally applicable to various other objects that incorporate one or more windings. A few example systems and methods that can be associated with a transformer for example, are provided below.

A first exemplary system in accordance with an embodiment of the disclosure can include a transformer, a first current monitoring element, a second current monitoring element and a fault detector. The first current monitoring element can be configured to provide a first current measurement based on monitoring a primary winding current of the transformer. The second current monitoring element can configured to provide a second current measurement based on monitoring a secondary winding current of the transformer. The fault detector can be configured to receive each of the first current measurement and the second current measurement and to detect using the first current measurement and the second current measurement, a turn-to-turn fault in the transformer by executing a procedure that can include determining a steady-state differential current value, determining a steady-state voltage value, determining one or more compensating factors by dividing the steady-state differential current value by the steady-state voltage value, determining a magnetizing current amplitude indicator by multiplying the steady-state voltage value by the one or more compensating factors, determining a compensated differential current value by combining the steady-state differential current value with a modifier value, the modifier value incorporating the magnetizing current amplitude indicator, comparing the compensated differential current value against a threshold value, declaring an occurrence of the turn-to-turn fault in the transformer when the compensated differential current value exceeds the threshold value, and executing a remedial operation comprising at least one of transmitting an alarm or operating a protection relay.

The modifier value can be equal to the magnetizing current amplitude indicator. Combining the steady-state differential current value with the modifier value can include subtracting the modifier value from the steady-state differential current value. The amplitude of the magnetizing current amplitude indicator can be directly proportional to an amplitude of an operating voltage of the transformer. The occurrence of the turn-to-turn fault in the transformer can be declared when the compensated differential current value exceeds the threshold value for a predetermined period of time and the exemplary system can include a user interface configured to accept a user input indicative of the predetermined period of time. The transformer can be a multi-phase transformer and each of the primary winding current and the secondary winding current can correspond to a first pair of windings among a plurality of windings of the multi-phase transformer and the fault detector can be configured to detect the turn-to-turn fault when present in any one of the plurality of windings of the multi-phase transformer. The transformer can be a three-phase transformer having at least two sets of windings and the fault detector can be configured to execute the procedure for each phase of the three-phase transformer.

A second exemplary system in accordance with an embodiment of the disclosure can include a multi-phase transformer, an electrical current monitoring system, and a fault detector. The electrical current monitoring system can be configured to provide a set of primary electrical current measurements based on monitoring each of a plurality of primary winding currents of the multi-phase transformer and a set of secondary electrical current measurements based on monitoring each of a plurality of secondary winding currents of the multi-phase transformer. The fault detector can be configured to receive the set of primary electrical current measurements and the set of secondary electrical current measurements and to detect using the set of primary electrical current measurements and the set of secondary electrical current measurements, a turn-to-turn fault in the multi-phase transformer by executing a procedure that can include determining a steady-state differential current value for each phase of the multi-phase transformer, determining a steady-state differential voltage value for each phase of the multi-phase transformer, determining one or more compensating factors by dividing the steady-state differential current value by the steady-state voltage value for each phase of the multi-phase transformer, determining a magnetizing current amplitude indicator for each phase of the multi-phase transformer by multiplying a respective steady-state voltage value by one or more compensating factors, determining a compensated differential current value for each phase of the multi-phase transformer by combining a respective steady-state differential current value with a respective modifier value, each respective modifier value incorporating a respective magnetizing current amplitude indicator, comparing the compensated differential current value for each phase of the multi-phase transformer against a threshold value for each phase of the multi-phase transformer, declaring an occurrence of the turn-to-turn fault in the transformer when at least one of the compensated differential current values exceeds the threshold value, and executing a remedial operation comprising at least one of transmitting an alarm or operating a protection relay.

The respective modifier value can be equal to the respective magnetization current amplitude indicator. Combining the respective steady-state differential current value with the respective modifier value can include subtracting the respective modifier value from the respective steady-state differential current value. The amplitude of the respective magnetizing current amplitude indicator can be directly proportional to an amplitude of a respective phase operating voltage of the transformer. The occurrence of the turn-to-turn fault in the transformer can be declared when the at least one of the compensated differential current values exceeds the threshold value for a predetermined period of time and the exemplary system can include a user interface configured to accept a user input indicative of the predetermined period of time. The transformer can be a three-phase transformer and the fault detector can be configured to detect the turn-to-turn fault when present in any one of the plurality of windings of the three-phase transformer.

An exemplary method in accordance with an embodiment of the disclosure can include receiving in a fault detector, a first current measurement based on monitoring a primary winding current of a transformer, receiving in the fault detector, a second current measurement based on monitoring a secondary winding current of a transformer, using the first current measurement and the second current measurement to determine a steady-state differential current value and a steady-state voltage value, determining one or more compensating factors by dividing the steady-state differential current value by the steady-state voltage value, determining a magnetizing current amplitude indicator by multiplying the steady-state voltage value by the one or more compensating factors, determining a compensated differential current value by combining the steady-state differential current value with a modifier value, the modifier value incorporating the magnetizing current amplitude indicator, comparing the compensated differential current value against a threshold value, declaring an occurrence of the turn-to-turn fault in the transformer when the compensated differential current value exceeds the threshold value, and executing a remedial operation comprising at least one of transmitting an alarm or operating a protection relay. The modifier value can be equal to the magnetizing current amplitude indicator. Combining the steady-state differential current value with the modifier value can include subtracting the modifier value from the steady-state differential current value.

Many modifications and other embodiments of the example descriptions set forth herein to which these descriptions pertain will come to mind having the benefit of the teachings presented in the foregoing descriptions and the associated drawings. Thus, it will be appreciated the disclosure may be embodied in many forms and should not be limited to the exemplary embodiments described above. Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed is:

1. A three-phase power line system comprising:
    a first power line conductor that transfers power in a first phase, a second power line conductor that transfers power in a second phase, and a third power line conductor that transfers power in a third phase;
    a three-phase shunt reactor coupled to the three-phase power line system;
    a first electrical current monitoring element configured to provide a first current measurement based on monitoring a first phase current flowing through a first winding of the three-phase shunt reactor;
    a second electrical current monitoring element configured to provide a second current measurement based on monitoring a second phase current flowing through a second winding of the three-phase shunt reactor;
    a third electrical current monitoring element configured to provide a third current measurement based on monitoring a third phase current flowing through a third winding of the three-phase shunt reactor;
    a first voltage monitoring element configured to provide a first voltage measurement based on monitoring a first phase voltage present on the first power line conductor;
    a second voltage monitoring element configured to provide a second voltage measurement based on monitoring a second phase voltage present on the second power line conductor;
    a third voltage monitoring element configured to provide a third voltage measurement based on monitoring a third phase voltage present on the third power line conductor; and
    a fault detector configured to receive and to use each of the first phase current measurement, the second phase current measurement, the third phase current measurement, the first phase voltage measurement, the second phase voltage measurement, and the third phase voltage measurement to detect a turn-to-turn fault in at least one of the first winding, the second winding, or the third winding of the three-phase shunt reactor by executing a procedure comprising:
        calculating a difference value between a voltage-based parameter and a current-based parameter, wherein the voltage-based parameter is indicative of a normalized negative voltage imbalance and the current-based parameter is indicative of a normalized negative current imbalance; and
        declaring an occurrence of the turn-to-turn fault in at least one of the first winding, the second winding, or the third winding of the three-phase shunt reactor when the difference value is not equal to zero.

2. The system of claim 1, wherein the voltage-based parameter is a first normalized value derived at least in part by comparing a negative sequence voltage value to a positive sequence voltage value, and the current-based parameter is a second normalized value derived at least in part by comparing a negative sequence current value to a positive sequence current value.

3. The system of claim 2, wherein each of the negative sequence voltage value and the positive sequence voltage value is represented in a vector representation of phase voltages present in the three-phase power line system.

4. The system of claim 2, wherein the first normalized value is indicated as a first percentage and the second normalized value is indicated as a second percentage.

5. The system of claim 2, wherein the first normalized value is equal to the second normalized value when the turn-to-turn fault is not present in the three-phase shunt reactor.

6. The system of claim 2, wherein the fault detector is further configured to execute a remedial operation upon the occurrence of the turn-to-turn fault, the remedial action comprising operating a protection relay.

7. The system of claim 6, wherein the remedial action is executed based on the difference value exceeding a settable threshold value.

8. The system of claim 7, wherein the difference value is defined as at least one of an absolute numerical value or an angular value, and the settable threshold value is correspondingly based on the at least one of an absolute numerical value or an angular value.

9. The system of claim 2, wherein the difference value is defined as an angular value, and an identification of the turn-to-turn fault in a particular one of the first winding, the second winding, or the third winding of the three-phase shunt reactor is determined based on the angular value.

10. The system of claim 9, wherein the first winding is identified when the angular value is substantially equal to about (180 degrees±a tolerance value), the second winding is identified when the angular value is substantially equal to about (−60 degrees±the tolerance value), and the third winding is identified when the angular value is substantially equal to about (+60 degrees±the tolerance value).

11. A turn-to-turn fault detector comprising:
a first input interface configured to receive a first phase current measurement that is based on monitoring a first phase current flowing through a first winding of a three-phase shunt reactor, wherein the first winding is coupled to a first power line conductor of a three-phase power line system;
a second input interface configured to receive a second phase current measurement that is based on monitoring a second phase current flowing through a second winding of the three-phase shunt reactor, wherein the second winding is coupled to a second power line conductor of the three-phase power line system;
a third input interface configured to receive a third phase current measurement that is based on monitoring a third phase current flowing through a third winding of the three-phase shunt reactor, wherein the third winding is coupled to a third power line conductor of the three-phase power line system;
a fourth input interface configured to receive a first phase voltage measurement that is based on monitoring a first phase voltage present on the first power line conductor of the three-phase power line system;
a fifth input interface configured to receive a second phase voltage measurement that is based on monitoring a second phase voltage present on the second power line conductor of the three-phase power line system;
a sixth input interface configured to receive a third phase voltage measurement that is based on monitoring a third phase voltage present on the third power line conductor of the three-phase power line system; and
at least one processor configured to use each of the first phase current measurement, the second phase current measurement, the third phase current measurement, the first phase voltage measurement, the second phase voltage measurement, and the third phase voltage measurement to detect a turn-to-turn fault in at least one of the first winding, the second winding, or the third winding of the three-phase shunt reactor by executing a procedure comprising:
calculating a difference value between a voltage-based parameter and a current-based parameter, wherein the voltage-based parameter is indicative of a normalized negative voltage imbalance and the current-based parameter is indicative of a normalized negative current imbalance; and
declaring a turn-to-turn fault in at least one of the first winding, the second winding, or the third winding of the three-phase shunt reactor when the difference value is not equal to zero.

12. The detector of claim 11, wherein the voltage-based parameter is a first normalized value derived at least in part by comparing a negative sequence voltage value to a positive sequence voltage value, and the current-based parameter is a second normalized value derived at least in part by comparing a negative sequence current value to a positive sequence current value.

13. The detector of claim 12, wherein each of the negative sequence voltage value and the positive sequence voltage value is represented in a vector representation of phase voltages present in the three-phase power line system, the first normalized value is indicated as a first percentage and the second normalized value is indicated as a second percentage.

14. The detector of claim 12, wherein the first normalized value is equal to the second normalized value when the turn-to-turn fault is not present in the three-phase shunt reactor.

15. The detector of claim 12, wherein the difference value is defined as at least one of an absolute numerical value or an angular value, and an identification of the turn-to-turn fault in a particular one of the first winding, the second winding, or the third winding of the three-phase shunt reactor is determined based on the at least one of the absolute numerical value or the angular value.

16. The detector of claim 15, wherein the first winding is identified when the angular value is substantially equal to about (180 degrees±a tolerance value), the second winding is identified when the angular value is substantially equal to about (−60 degrees±the tolerance value), and the third winding is identified when the angular value is substantially equal to about (+60 degrees±the tolerance value).

17. A method for detecting a turn-to-turn fault in a three-phase shunt reactor coupled to a three-phase power line system, the method comprising:
receiving a first phase current measurement that is based on monitoring a first phase current flowing through a first winding of the three-phase shunt reactor;
receiving a second phase current that is based on monitoring a second phase current flowing through a second winding of the three-phase shunt reactor;
receiving a third phase current measurement that is based on monitoring a third phase current flowing through a third winding of the three-phase shunt reactor;
receiving a first phase voltage measurement that is based on monitoring a first phase voltage present on a first power line conductor of the three-phase power line system;
receiving a second phase voltage measurement that is based on monitoring a second phase voltage present on a second power line conductor of the three-phase power line system;
receiving a third phase voltage measurement that is based on monitoring a third phase voltage present on a third power line conductor of the three-phase power line system;
using each of the first phase current measurement, the second phase current measurement, the third phase current measurement, the first phase voltage measurement, the second phase voltage measurement, and the third phase voltage measurement and detect therefrom, the turn-to-turn fault in at least one of the first winding, the second winding, or the third winding of the three-phase shunt reactor by calculating a difference value between a voltage-based parameter and a current-based parameter, wherein the voltage-based parameter is indicative of a normalized negative voltage imbalance and the current-based parameter is indicative of a normalized negative current imbalance; and
declaring the turn-to-turn fault in at least one of the first winding, the second winding, or the third winding of the three-phase shunt reactor when the difference value is not equal to zero.

18. The method of claim 17, wherein the voltage-based parameter is a first normalized value derived at least in part by comparing a negative sequence voltage value to a positive sequence voltage value, and the current-based parameter is a second normalized value derived at least in part by comparing a negative sequence current value to a positive sequence current value.

19. The method of claim 18, wherein the difference value is defined as at least one of an absolute numerical value or an angular value, and an identification of the turn-to-turn fault in a particular one of the first winding, the second winding, or the third winding of the three-phase shunt reactor is determined based on the at least one of the absolute numerical value or the angular value.

20. The method of claim 19, wherein the first winding is identified when the angular value is substantially equal to about (180 degrees±a tolerance value), the second winding is identified when the angular value is substantially equal to about (−60 degrees±the tolerance value), and the third winding is identified when the angular value is substantially equal to about (+60 degrees±the tolerance value).

\* \* \* \* \*